(12) United States Patent
Goden et al.

(10) Patent No.: US 10,819,931 B2
(45) Date of Patent: Oct. 27, 2020

(54) PHOTOELECTRIC CONVERSION DEVICE, IMAGING SYSTEM AND MOBILE BODY

(71) Applicant: CANON KABUSHIKI KAISHA, Tokyo (JP)

(72) Inventors: Tatsuhito Goden, Machida (JP); Hidekazu Takahashi, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/362,844

(22) Filed: Mar. 25, 2019

(65) Prior Publication Data

US 2019/0306448 A1 Oct. 3, 2019

(30) Foreign Application Priority Data

Mar. 29, 2018 (JP) ................................ 2018-064782

(51) Int. Cl.
*H04N 5/374* (2011.01)
*H04N 5/3745* (2011.01)
*H04N 5/378* (2011.01)
*H01L 27/30* (2006.01)

(52) U.S. Cl.
CPC ......... *H04N 5/3745* (2013.01); *H01L 27/307* (2013.01); *H04N 5/378* (2013.01)

(58) Field of Classification Search
None
See application file for complete search history.

(56) References Cited

U.S. PATENT DOCUMENTS

| | | | |
|---|---|---|---|
| 5,973,265 A | 10/1999 | O'Brien et al. | |
| 7,561,199 B2 | 7/2009 | Noda et al. | |
| 7,692,713 B2 | 4/2010 | Kinugasa et al. | |
| 7,741,593 B2 | 6/2010 | Iwata et al. | |
| 7,817,199 B2 | 10/2010 | Yamashita et al. | |
| 7,920,192 B2 | 4/2011 | Watanabe et al. | |
| 7,982,789 B2 | 7/2011 | Watanabe et al. | |
| 8,081,245 B2 | 12/2011 | Itano et al. | |
| 8,159,577 B2 | 4/2012 | Iwata et al. | |
| 8,223,238 B2 | 7/2012 | Kuroda et al. | |
| 8,259,205 B2 | 9/2012 | Noda et al. | |
| 8,400,546 B2 | 3/2013 | Itano et al. | |
| 8,749,683 B2 | 6/2014 | Minowa et al. | |
| 9,165,960 B2* | 10/2015 | Tai | H01L 27/14643 |
| 9,774,810 B2 | 9/2017 | Tashiro et al. | |

(Continued)

FOREIGN PATENT DOCUMENTS

| | | |
|---|---|---|
| JP | 2003-009003 A | 1/2003 |
| JP | 2006-319529 A | 11/2006 |
| JP | 2007-067491 A | 3/2007 |

*Primary Examiner* — James M Hannett
(74) *Attorney, Agent, or Firm* — Venable LLP

(57) ABSTRACT

A photoelectric conversion device including: a photoelectric conversion unit; a storing unit configured to store a photoelectric conversion signal from the photoelectric conversion unit; a first amplifier transistor configured to output a photoelectric conversion signal from the storing unit; a transistor configured to write an output signal of the first amplifier transistor to a first terminal of a holding capacitor; a second amplifier transistor, a gate of which is connected to the first terminal, and which is configured to output a voltage in accordance with a voltage of the first terminal; and a control unit configured to switch a voltage of a second terminal of the holding capacitor.

16 Claims, 14 Drawing Sheets

(56) References Cited

U.S. PATENT DOCUMENTS

| | | |
|---|---|---|
| 10,084,980 B2 | 9/2018 | Moriyama et al. |
| 2014/0139713 A1* | 5/2014 | Gomi ............... H01L 27/14618 |
| | | 348/308 |
| 2014/0339400 A1* | 11/2014 | Maeda ................. G06F 3/0412 |
| | | 250/214 C |
| 2016/0105622 A1 | 4/2016 | Tamaki |
| 2017/0212221 A1 | 7/2017 | Goden et al. |
| 2018/0227527 A1 | 8/2018 | Tamaki |
| 2018/0372539 A1 | 12/2018 | Goden |

* cited by examiner

PHOTOELECTRIC CONVERSION DEVICE, IMAGING SYSTEM AND MOBILE BODY

BACKGROUND OF THE INVENTION

Field of the Invention

The present invention relates to a photoelectric conversion device, an imaging system and a mobile body.

Description of the Related Art

A known configuration of a pixel of a photoelectric conversion device is that a signal from a photoelectric conversion unit is output from a first amplifier unit and held in a holding capacitor, and the voltage held in the holding capacitor is output from the second amplifier unit. Japanese Patent Application Publication No. 2003-9003 discloses a photoelectric conversion device of which pixel includes a first amplifier unit, a second amplifier unit and a holding capacitor. According to Japanese Patent Application Publication No. 2003-9003, the first amplifier unit and the second amplifier unit are source-follower circuits, one terminal of the holding capacitor is connected to the output side of the first amplifier unit, and the other terminal thereof has a fixed potential.

SUMMARY OF THE INVENTION

In the configuration disclosed in Japanese Patent Application Publication No. 2003-9003 however, the driving method to implement optimum pixel circuit operation has not been sufficiently considered.

It is an object of the present invention to provide a photoelectric conversion device which has a better performance than prior arts.

The first aspect of the disclosure is a photoelectric conversion device including
  a photoelectric conversion unit;
  a storing unit configured to store a photoelectric conversion signal from the photoelectric conversion unit;
  a first amplifier transistor configured to output a photoelectric conversion signal from the storing unit;
  a transistor configured to write an output signal of the first amplifier transistor to a first terminal of a holding capacitor;
  a second amplifier transistor, a gate of which is connected to the first terminal, and which is configured to output a voltage in accordance with a voltage of the first terminal; and
  a control unit configured to switch a voltage of a second terminal of the holding capacitor.

According to the present invention, a photoelectric conversion device, which has a better performance than prior arts, can be provided.

Further features of the present invention will become apparent from the following description of exemplary embodiments with reference to the attached drawings.

DESCRIPTION OF THE EMBODIMENTS

Figure 1:
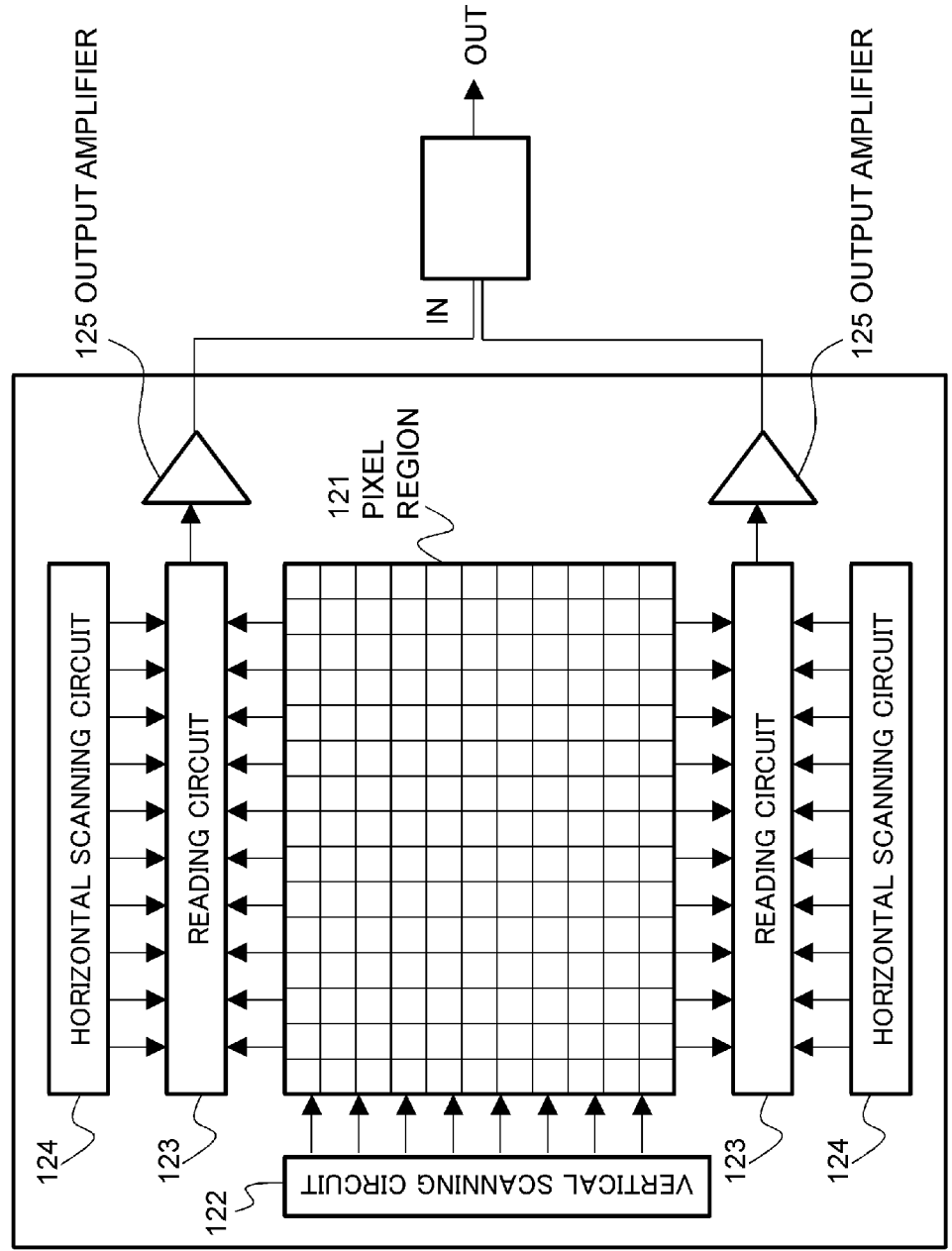
FIG. 1 is a diagram depicting a photoelectric conversion device according to Embodiment 1.

Embodiments of the present invention will be described with reference to the drawings. The present invention, however, is not limited to the following embodiments, but may be appropriately modified within a scope that does not deviate from the summary thereof. In the drawings to be described below, elements having a same function are denoted with a same reference sign, and description thereof may be omitted or simplified.

A photoelectric conversion device is a semiconductor device which includes a plurality of pixels to convert light into an electric signal, and is called a solid-state image pickup element, an image sensor or a photoelectric convertor. The photoelectric conversion device includes a CCD image sensor and a CMOS image sensor. In the following, a configuration example, in the case of applying the present invention to a CMOS image sensor, will be described as a preferred example of applying the present invention.

Embodiment 1

General Configuration of Photoelectric Conversion Device

FIG. 1 is a block diagram of a photoelectric conversion device 100 according to Embodiment 1. The photoelectric conversion device 100 includes a pixel region 121, a vertical scanning circuit 122, two reading circuits 123, two horizontal scanning circuits 124 and two output amplifiers 125. A region other than the pixel region 121 is a peripheral circuit region. In the pixel region 121, a plurality of pixels are arrayed two-dimensionally. In the peripheral circuit region, the reading circuit 123, such as a column amplifier, a correlated double sampling (CDS) circuit and an adder circuit, is disposed, so as to amplify and add a signal, which is read from the pixel of a row selected by the vertical scanning circuit 122 via a vertical signal line. The horizontal scanning circuit 124 generates a signal to sequentially read a signal from the reading circuit 123 based on the pixel signal. The output amplifier 125 amplifies a signal in a column selected by the horizontal scanning circuit 124, and outputs the amplified signal. Here a configuration of using electrons as signal charges will be described as an example, but holes may be used as signal charges.

Reading Circuit

Figure 2:
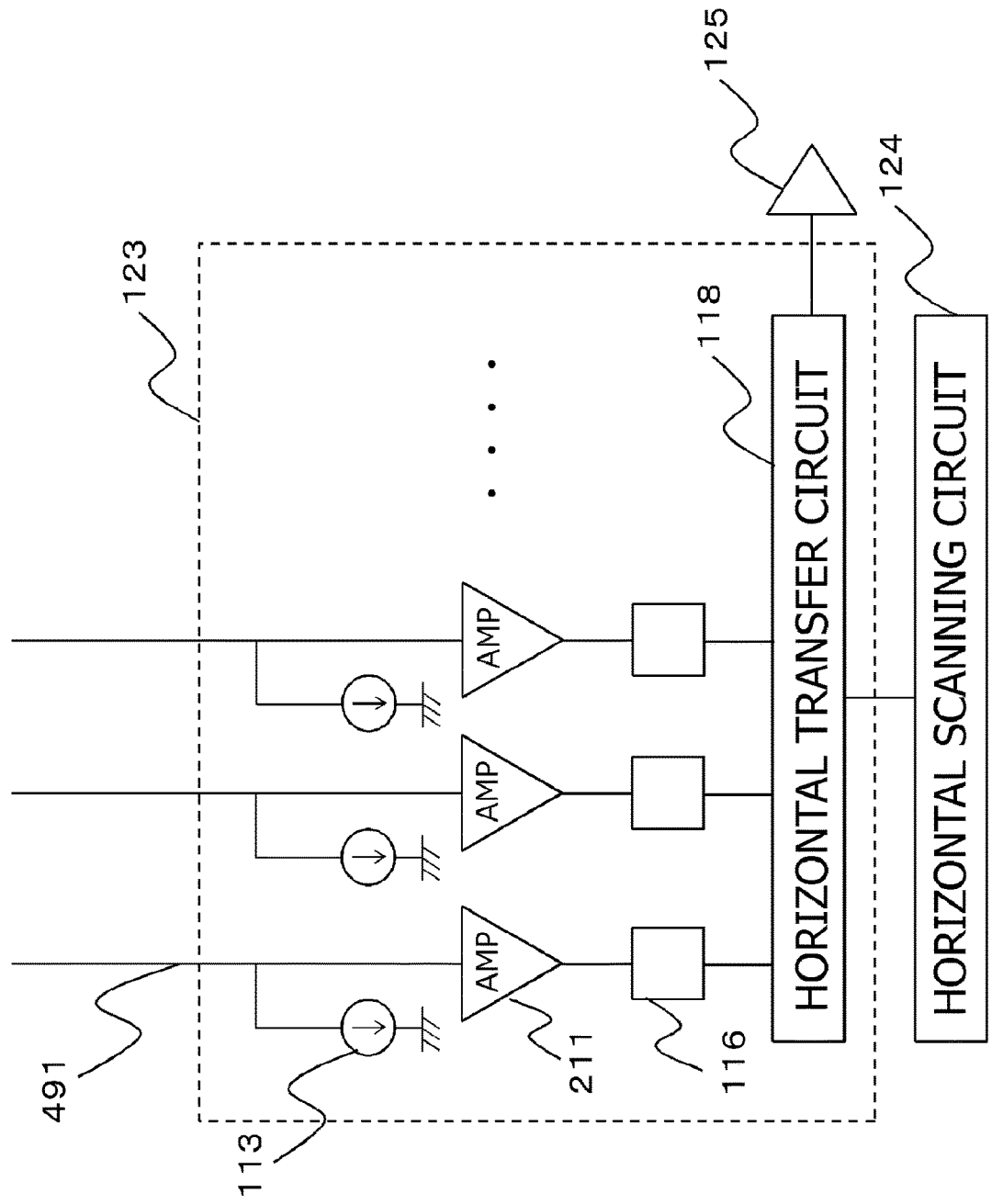
FIG. 2 is a configuration example of a reading circuit according to Embodiment 1.

FIG. 2 is a configuration example of the reading circuit 123 illustrated in FIG. 1. A reference sign that is the same as FIG. 1 is a same member. In FIG. 2, the reading circuit 123 includes output lines 491 corresponding to each pixel electrode, constant current circuits 113, amplifier circuits 211 corresponding to each output line 491, signal storing units 116, and a horizontal transfer circuit 118. Further in FIG. 2, a horizontal scanning circuit 124 and an output amplifier 125 are also illustrated. To each output line 491, the constant current circuit 113, which applies a load on a second amplifier transistor disposed in a later mentioned pixel circuit, and an amplifier circuit 211, are connected, and the signal storing unit 116 is connected to the output node of the amplifier circuit 211.

The amplifier circuit 211 amplifies voltage at a level in accordance with the irradiation amount of light from the pixel circuit (S signal) and voltage at a noise level (N signal), and outputs the amplified signals. The signal storing unit 116 stores the S signal and N signal amplified by the amplifier circuit 211 respectively. The horizontal scanning circuit 124 sequentially outputs the S signal and N signal stored in the signal storing unit 116 to the horizontal transfer circuit 118 for each column, and the horizontal transfer circuit 118 transmits the signals to the signal processing circuit (not illustrated) via the output amplifier 125. The signal processing circuit generates a difference signal between the S signal and N signal.

Pixel Circuit

Figure 3:
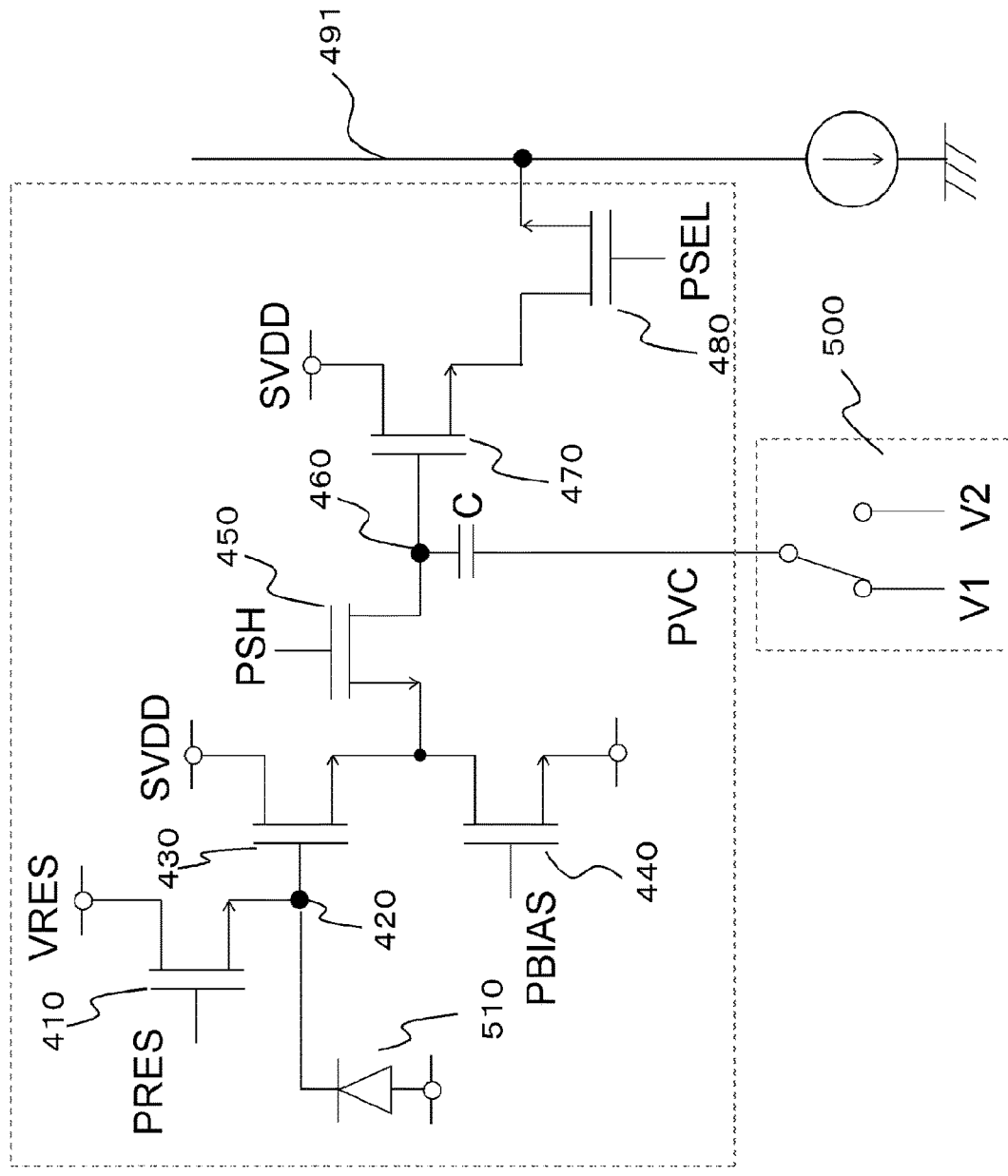
FIG. 3 is an example of an equivalent circuit diagram of a pixel circuit according to Embodiment 1.

FIG. 3 is an equivalent circuit diagram of a pixel circuit which is disposed corresponding to each pixel. In the following, a configuration using NMOS as each transistor of the pixel circuit will be described, but PMOS may be used instead.

A photoelectric conversion element 510 generates and stores charges in accordance with the incident light. A floating diffusion (hereafter FD) 420, which is a first node, receives charges (photoelectric conversion signal) from the photoelectric conversion element 510, and converts the charges into voltages. The FD 420 is connected to the gate of the first amplifier transistor 430. The FD 420 of the first node is configured so that the reset potential VRES can be written via a reset transistor 410. The FD 420 is an example of the storing unit according to the present invention.

The source of the first amplifier transistor 430 is connected to the ground potential via a transistor 440. The drain of the first amplifier transistor 430 is connected to the reference potential SVDD. The source of the first amplifier transistor 430 is connected to the gate of a second amplifier transistor 470 via a transistor 450 and a memory (hereafter MEM) 460.

The transistor 450 writes the output signal of the first amplifier transistor 430 to the holding capacitor C via one terminal (first terminal).

The drain of the second amplifier transistor 470 is connected to the reference potential SVDD. The source of the second amplifier transistor 470 is connected to an output line 492 via the selection transistor 480. To the gate (input terminal) of the second amplifier transistor 470, the first terminal of the holding capacitor C is connected, and the second amplifier transistor 470 outputs a signal in accordance with the voltage thereof.

The first amplifier transistor 430 and the second amplifier transistor 470 constitute an NMOS source-follower circuit, which outputs a signal in accordance with the input voltage.

The one terminal (first terminal) of the holding capacitor C is connected to the MEM 460 of the second node, and the other terminal (second terminal) is connected to a voltage switching circuit 500 outside the pixel circuit. The holding capacitor C may have any structure as long as a functional capacitor can be formed, but if a metal-insulator metal (hereafter MIM) capacitor, which can be layered onto the pixel circuit, is used, the layout area can be reduced. Further, the MIM can more easily implement a configuration that switches voltage by connecting the voltage switching circuit 500 to the terminal of the holding capacitor C.

To the gates of the reset transistor 410, the transistor 440, the transistor 450 and the selection transistor 480, the control signals from the vertical scanning circuit 122 in FIG. 1 are commonly input for each row.

The voltage switching circuit 500 is integrated into the vertical scanning circuit 122, and the output of the voltage switching circuit 500 is also commonly connected to the terminal of the holding capacitor C of each pixel circuit for each row. The voltage switching circuit 500 switches voltage V1 and voltage V2, and outputs the selected voltage (V1>V2). The output of the voltage switching circuit 500 may be independently connected to the terminal of the holding capacitor C of each pixel circuit.

Method of Driving Pixel Circuit

Figure 4:
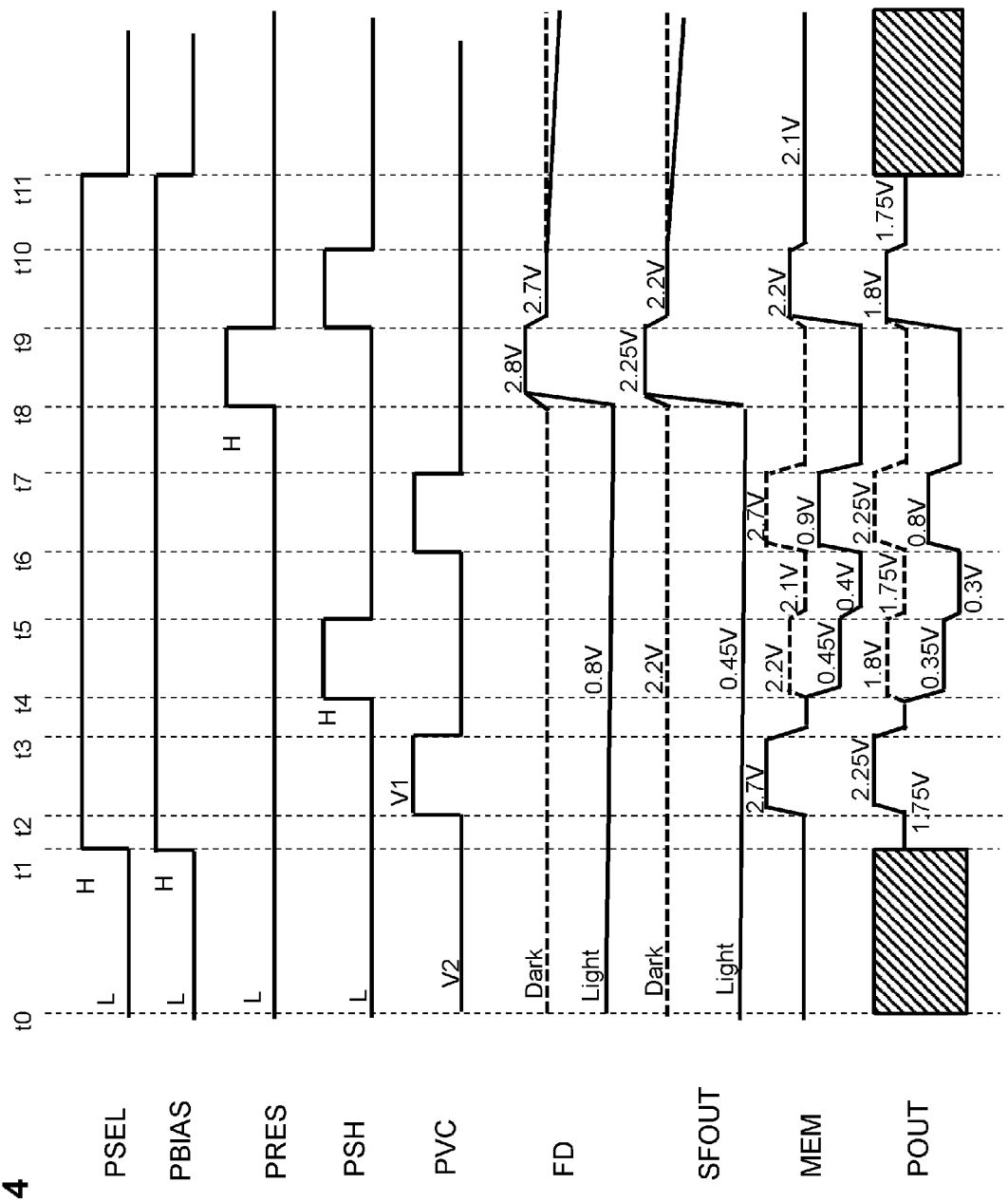
FIG. 4 is a diagram depicting driving of the pixel circuit according to Embodiment 1.

Driving of the pixel circuit in FIG. 3 will be described with reference to FIG. 4. In FIG. 4, PSEL is a waveform that is input to the gate of the selection transistor 480, PBIAS is a waveform that is input to the gate of the transistor 440, and PRES is a waveform that is input to the gate of the reset transistor 410. PSH is a waveform that is input to the gate of the transistor 450, and PVC is a waveform that is input to the terminal of the holding capacitor C.

FD is a potential of the first node 420, and SFOUT is a potential of the source of the second amplifier transistor 470. The potential of SFOUT is a voltage that is lower than the potential of the first node 420 by the amount of the gate-source voltage of the first amplifier transistor 430.

MEM is a potential of the second node 460, and POUT is a potential of the output line 492. The potential of POUT is a voltage that is lower than the potential of the second node MEM by the amount of the gate-source voltage of the second amplifier transistor 430.

Time t0 is an arbitrary time when charging starts. At time t1, PSEL and PBIAS are changed from the Low level (L level) to the High level (H level), and the selection transistor 480 and the transistor 440 are turned ON.

In the second node MEM to which the holding capacitor C is connected, 2.1 V is held as the voltage at a noise level (N signal), which corresponds to the potential to which the first node FD is reset by the reset transistor before charging. Here 1.75 V is output to the output line 492 via the second amplifier transistor 470 and the selection transistor 480.

The H level of PBIAS is set such that the transistor 440 operates as a current source to output a desired current value.

At time t2, PVC is changed from the potential V2 to the potential V1 (V1>V2). Here the potential of the second node MEM rises to 2.7 V because of capacity coupling, and the potential of the output line POUT rises to 2.25 V, and is output. At this timing, the reading circuit 123 reads the potential (N signal) of the output line POUT.

At time t3, PVC is changed from the potential V1 to the potential V2. The potential of the second node MEM returns to 2.1 V, and the potential of the output line POUT returns to 1.75 V.

Then at time t4, PSH is changed from the L level to the H level, and the transistor 450 is turned ON. By this operation, the voltage (S signal), corresponding to the charges stored in the first node FD 420 by the irradiation of the light, is transferred to the second node MEM 460. The broken line indicates the case where the light is not irradiated (Dark), and the solid line indicates the case where the light is irradiated (Light).

In the case where the light is not irradiated, the potential of the first node FD is 2.7 V, and the source potential SFOUT of the second amplifier transistor 470 and the potential of the second node MEM are 2.2 V. The potential output from the output line POUT is 1.8 V.

In the case where the light is irradiated, the potential of the first node FD is 0.8 V, and the source potential SFOUT of the second amplifier transistor 470 and the potential of the second node MEM are 0.45 V. The potential output from the output line POUT is 0.35 V.

At time t5, PSH is changed from the H level to the L level, and the transistor 450 is turned OFF. Here the potential of the second node MEM 460 drops because of the parasitic capacitance between the gate of the transistor 450 and the second node MEM 460. In the case where the light is not irradiated, the potential of the second node MEM 460 drops from 2.2 V to 2.1 V, and the potential of the output line POUT becomes 1.75 V. In the case where the light is irradiated, the potential of the second node MEM 460 drops from 0.45 V to 0.4 V, and the potential of the output line POUT becomes 0.3 V.

At time t6, the potential of the PVC is changed from the potential V2 to the potential V1 (V1>V2). In the case where the light is not irradiated, the potential of the second node MEM rises to 2.7 V because of capacity coupling, and 2.25 V is output to the output line POUT. In the case where the light is irradiated, the potential of the second node MEM rises to 0.9 V because of capacity coupling, and 0.8 V is output to the output line POUT. At this timing, the reading circuit 123 reads the potential (S signal) of the output line POUT.

At time t7, the potential of PVC is changed from the potential V1 to the potential V2. In the case where the light is not irradiated, the potential of the second node MEM returns to 2.1 V, and the potential of the output line POUT returns to 1.75 V. In the case where the light is irradiated, the potential of the second node MEM returns to 0.4 V, and the potential of the output line POUT returns to 0.3 V.

Then at time t8, PRES is changed from the L level to the H level, and the reset transistor 410 is turned ON. Thereby the reset potential VRES (2.8 V) is written to the first node FD 420.

Then at time t9, PRES is changed from the H level to the L level, the reset transistor is turned OFF, PSH is changed from the L level to the H level, and the transistor 450 is turned ON. Thereby the potential 2.2 V at the noise level, which is the potential corresponding to the first node FD 420, is transferred to the second node MEM 460.

At time t10, PSH is changed from the H level to L level, and the transistor 450 is turned OFF. Here the potential of the second node MEM 460 drops because of the parasitic capacitance between the gate of the transistor 450 and the second node MEM 460. Thereby 2.1 V is held in the capacitor C as the voltage at the noise level (N signal).

Finally at time t11, PSEL and PBIAS are changed from the H level to the L level respectively, and the selection transistor 480 and the transistor 440 are turned OFF. Thereby charging is restarted. During charging, the potential at the noise level is held in the capacitor C.

In the period between t0 and t1 and the period after t11, the selection transistor 480 is turned OFF, and the pixel circuit is in an unselected state. The potential of the output line POUT during these periods is indicated by hatched lines.

In this way, according to Embodiment 1, the potential of PVC is changed from the potential V2 to the potential V1 (V1>V2) in the periods between t2 and t3 and between t6 and t7, and the potential of the output line POUT rises. The period between t2 and t3 is a period of reading a signal corresponding to the potential to which FD 420 is reset, and the period between t6 and t7 is a period of reading a photoelectric conversion signal based on the stored charges. In other words, the voltage switching circuit 500 controls the potential of PVC to V1 only during the period of reading the S signal and N signal, and to V2 during the other periods.

The voltage change amount $\Delta V_{MEM}$ in the second node MEM is given by $$\Delta V_{MEM} = (\Delta V_c \times C)/(C + C_x)$$

where $\Delta V_c$ is the voltage change amount of PVC, Cx is the parasitic capacitance in the second node MEM, and C is the holding capacitance. By determining the voltage change amount $\Delta V_c$ of PVC based on this relationship, the voltage change amount in the second node MEM can be set to an optimum value.

In the case of not changing the potential of PVC, the potential of the output line POUT becomes low, 0.3 V, at which a desired circuit operation may not be performed. For example, the voltage that is applied to the constant current circuit 113 in FIG. 2 becomes 0.3 V, which makes it difficult to ensure constant current. Therefore by changing the potential of PVC from the potential V2 to the potential V1, and increasing the potential of the output line POUT to 0.8 V, a malfunction of the constant current circuit 113 can be prevented, and the reading circuit 123 can accurately read the potential of the output line POUT.

In the pixel circuit of this embodiment, PMOS instead of NMOS may be used for each transistor. In this case, the first amplifier transistor 430 and the second amplifier transistor 470 constitute a PMOS source-follower circuit. The H level and the L level of the driving pulse are reversed compared with the case of using NMOS. The relationship of the voltage V1 and the voltage V2 output from the voltage switching circuit 500 also becomes V1<V2.

By only using an NMOS or a PMOS conductive type transistor for each transistor constituting the pixel circuit, the layout area can be reduced.

Comparative Example

Figure 5:
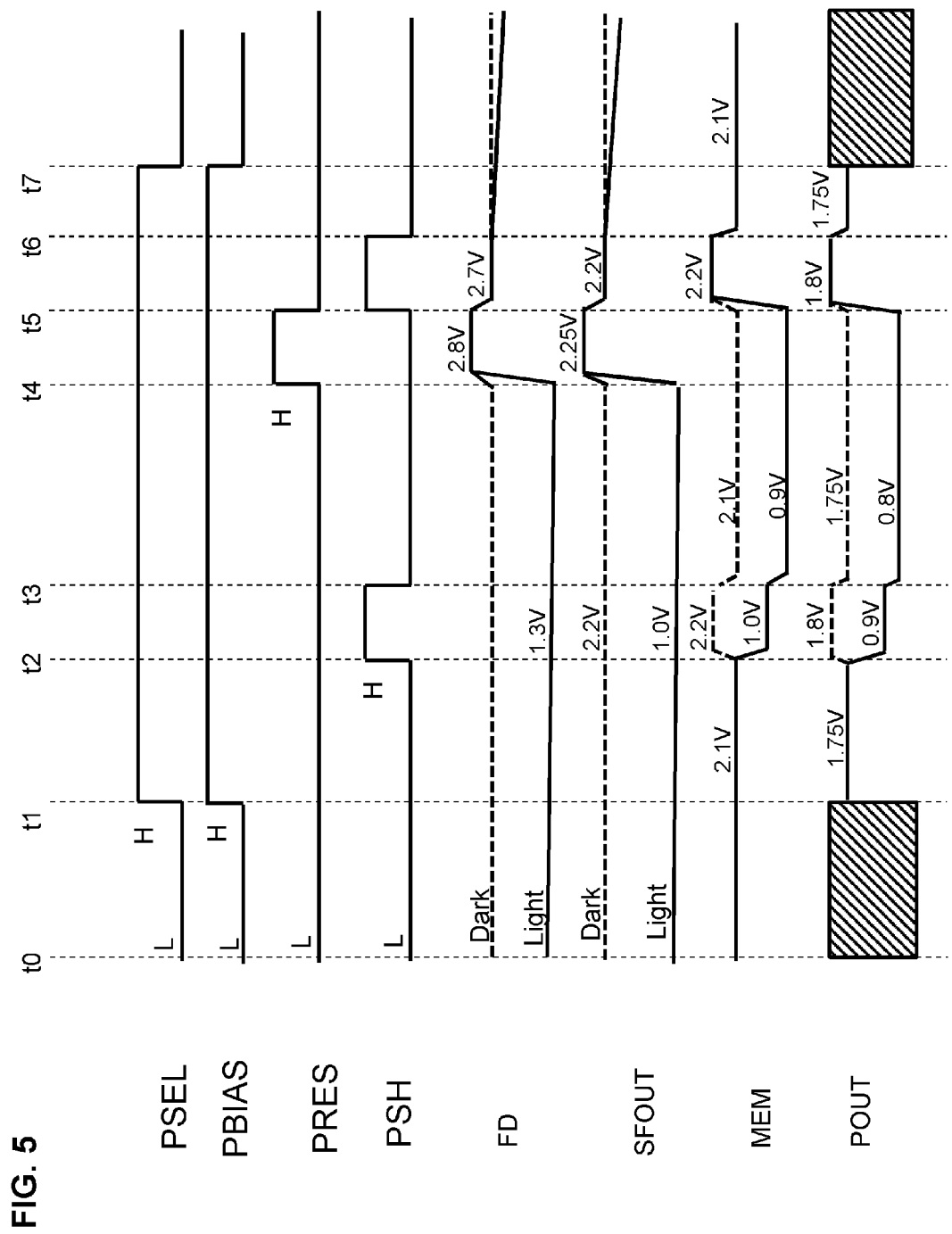
FIG. 5 is a diagram depicting driving of a comparative example.

FIG. 5 is a comparative example in the case of operating the pixel circuit without changing the potential of PVC.

Time t0 is an arbitrary time when charging starts. At time t1, PSEL and PBIAS are changed from the Low level (L level) to the High level (H level), and the selection transistor 480 and the transistor 440 are turned ON.

In the second node MEM connected to the holding capacitor C, 2.1 V is held as a voltage at a noise level (N signal) corresponding to the potential to which the first node FD is reset by the reset transistor before charging. To the output line 492, 1.75 V is output via the second amplifier transistor 470 and the selection transistor 480. At this timing, the reading circuit 123 reads the potential (N signal) of the output line POUT.

The H level of PBIAS is set so that the transistor 440 operates as a current source which outputs a desired current value.

Then at time t2, PSH is changed from the L level to the H level, and the transistor 450 is turned ON. By this operation, the voltage (S signal), corresponding to charges stored in the first node FD 420 by the irradiation of the light, is transferred to the second node MEM 460. The broken line indicates the case when the light is not irradiated (Dark), and the solid line indicates the case where the light is irradiated (Light).

In the case where the light is not irradiated, the potential of the first node FD is 2.7 V, and the source potential SFOUT of the second amplifier transistor 470 and the potential of the second node MEM are 2.2 V. The potential output from the output line POUT is 1.8 V.

In the case where the light is irradiated, the potential of the first node FD is 1.3 V, and the source potential SFOUT of the second amplifier transistor 470 and the potential of the second node MEM are 1.0 V. The potential output from the output line POUT is 0.9 V.

At time t3, PSH is changed from the H level to the L level, and the transistor 450 is turned OFF. Here the potential of the second node MEM 460 drops because of the parasitic capacitance between the gate of the transistor 450 and the second node MEM 460. In the case where the light is not irradiated, the potential of the second node MEM 460 drops from 2.2 V to 2.1 V, and the potential of the output line POUT becomes 1.75 V. In the case where the light is irradiated, the potential of the second node MEM 460 drops from 1.0 V to 0.9 V, and the potential of the output line POUT becomes 0.8 V.

Then at time t4, PRES is changed from the L level to the H level, and the reset transistor 410 is turned ON. Thereby the reset potential VRES (2.8 V) is written to the first node FD 420.

Then at time t5, PRES is changed from the H level to the L level, the reset transistor is turned OFF, PSH is changed from the L level to the H level, and the transistor 450 is turned ON. Thereby the potential 2.2 V at the noise level, which is the potential corresponding to the first node FD 420, is transferred to the second node MEM 460.

At time t6, PSH is changed from the H level to the L level, and the transistor 450 is turned OFF. Here the potential of the second node MEM 460 drops because of the parasitic capacitance between the gate of the transistor 450 and the second node MEM 460. Thereby 2.1 V is held in the capacitor C as the voltage at the noise level (N signal).

Finally at time t7, PSEL and PBIAS are changed from the H level to the L level respectively, and the selection transistor 480 and the transistor 440 are turned OFF. Thereby charging is restarted. During charging, the potential at the noise level is held in the capacitor C.

In the period between t0 and t1 and the period after t11, the selection transistor 480 is turned OFF, and the pixel circuit is in an unselected state. The potential of the output line POUT during these periods is indicated by the hatched lines.

It is assumed that 0.8 V potential of the output line POUT is the lower limit voltage of the circuit operation. Then if a potential is lower than 0.8 V, the constant current circuit 113 in FIG. 2 cannot perform a desired circuit operation, and cannot ensure a constant current. As described above, the S signal is read during the period between t3 and t4. The potential of the output line POUT is 0.8 V in the case where the light is irradiated, and is 1.75 V in the case where the light is not irradiated, which means that the potential difference is 0.95 V. According to Embodiment 1 (FIG. 4), on the other hand, the potential of the output line POUT is 0.8 V in the case where the light is irradiated, and is 2.25 V in the case where the light is not irradiated, which means that the potential difference is 1.45 V. In other words, in the period of reading the signal, the dynamic range can be expanded 53% by switching the terminal voltage of the capacitor C from the voltage V2 to the voltage V1 to shift the signal voltage.

Embodiment 2

Figure 6:
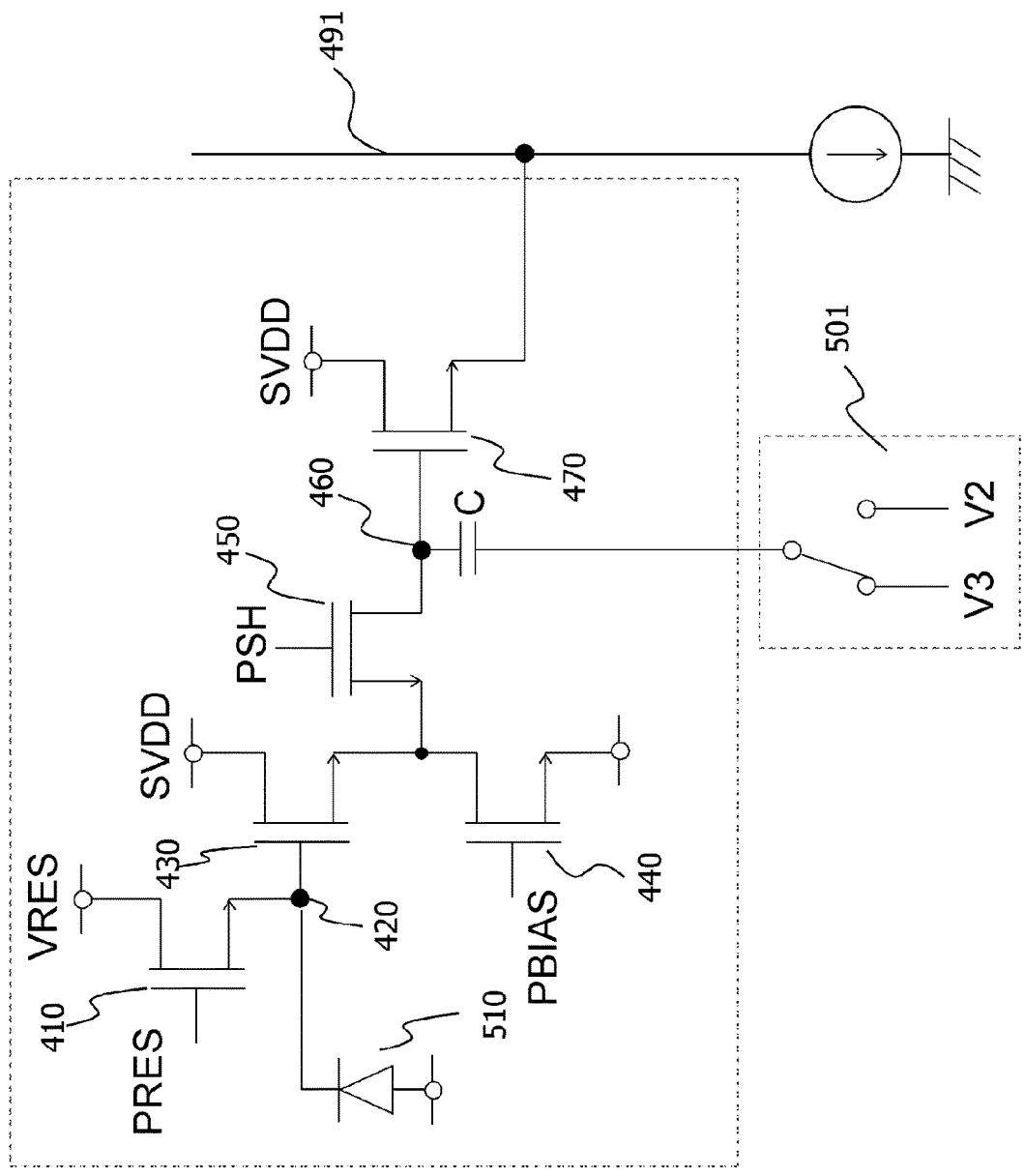
FIG. 6 is an example of an equivalent circuit diagram of a pixel circuit according to Embodiment 2.

FIG. 6 is an equivalent circuit diagram of a pixel circuit according to Embodiment 2. In Embodiment 1, the dynamic range is expanded compared with prior arts, while in Embodiment 2, a number of transistors is decreased.

The differences of Embodiment 2 from Embodiment 1 (FIG. 3) are that there is no selection transistor 480, the source of the second amplifier transistor is directly connected to the output line 492, and a voltage switching circuit 501 switches voltage V2 and voltage V3, and outputs the selected voltage (V2>V3).

Figure 7:
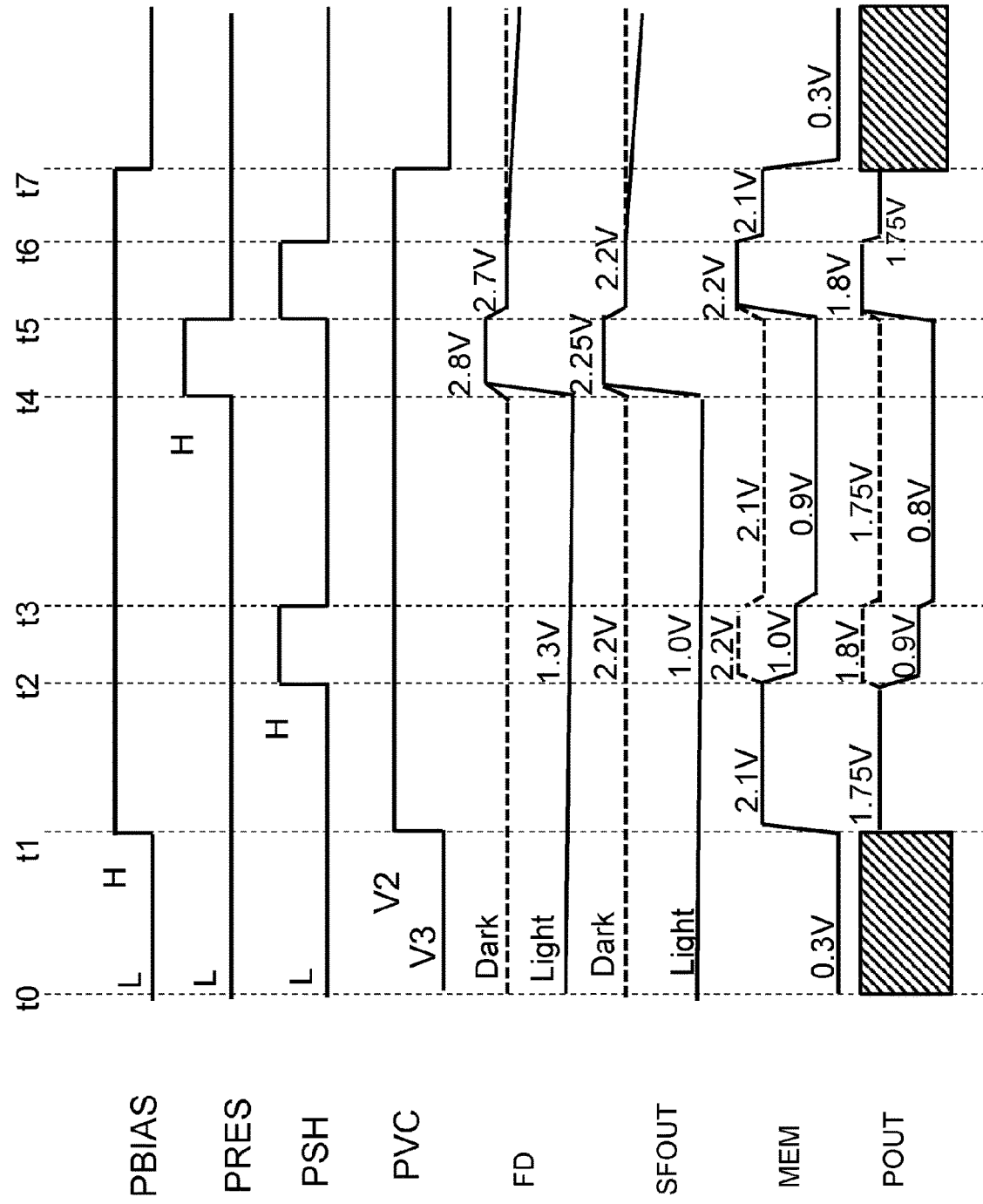
FIG. 7 is a diagram depicting driving of the pixel circuit according to Embodiment 2.

Driving of the pixel circuit in FIG. 6 will be described with reference to FIG. 7.

Time t0 is an arbitrary time when charging starts. Here PVC is the potential V3, and the potential of the second node MEM is 0.3 V. At this time, the second amplifier transistor 470 is in a non-driving state, and the pixel circuit is in an unselected state.

At time t1, PVC is changed from the potential V3 to the potential V2. Here the potential of the second node MEM rises from 0.3 V to 2.1 V because of capacity coupling. At this time, the second amplifier transistor enters a driving state, and the potential output from the output line POUT is 1.75 V.

The operations after this until time t2 are the same operations of (the comparative example) described with reference to FIG. 5, hence description thereof is omitted.

Finally at time t7, PBIAS is changed from the H level to the L level, the transistor 440 is turned OFF, and the potential of PVC is changed from the potential V2 to the potential V3. The potential of the second node MEM drops from 2.1 V to 0.3 V. At this time, the second amplifier transistor 470 is in a non-driving state, and the pixel circuit is in an unselected state. Thereby charging is restarted. During charging, the potential at the noise level is held in the capacitor C.

In the period between t0 and t1 and the period after t7, the second amplifier transistor 470 is in a non-driving state, and the pixel circuit is in an unselected state. The potential of the output line POUT during these periods is indicated by hatched lines.

In this way, according to Embodiment 2, the selected state and the non-selected state of the pixel circuit can be controlled by switching the terminal voltage of the capacitor C between the voltage V2 to the voltage V3, without the selection transistor 480 of Embodiment 1 depicted in FIG. 3. In other words, for a selected pixel, the voltage V2 is selected as the terminal voltage of the capacitor C, and the second amplifier transistor 470 is set to a driving state, and for an unselected pixel, the voltage V3 is selected as the terminal voltage of the capacitor C, and the second amplifier transistor 470 is switched to a non-driving state. Since the selection transistor 480 is unnecessary here, a number of transistors can be decreased.

In the pixel circuit of Embodiment 2, PMOS instead of NMOS may be used for each transistor, as described above. In this case, the H level and the L level of the driving pulse are reversed compared with the case of using NMOS, and the relationship of the voltage V2 and the voltage V3 output from the voltage switching circuit 501 also becomes V2<V3.

Embodiment 3

Figure 8:
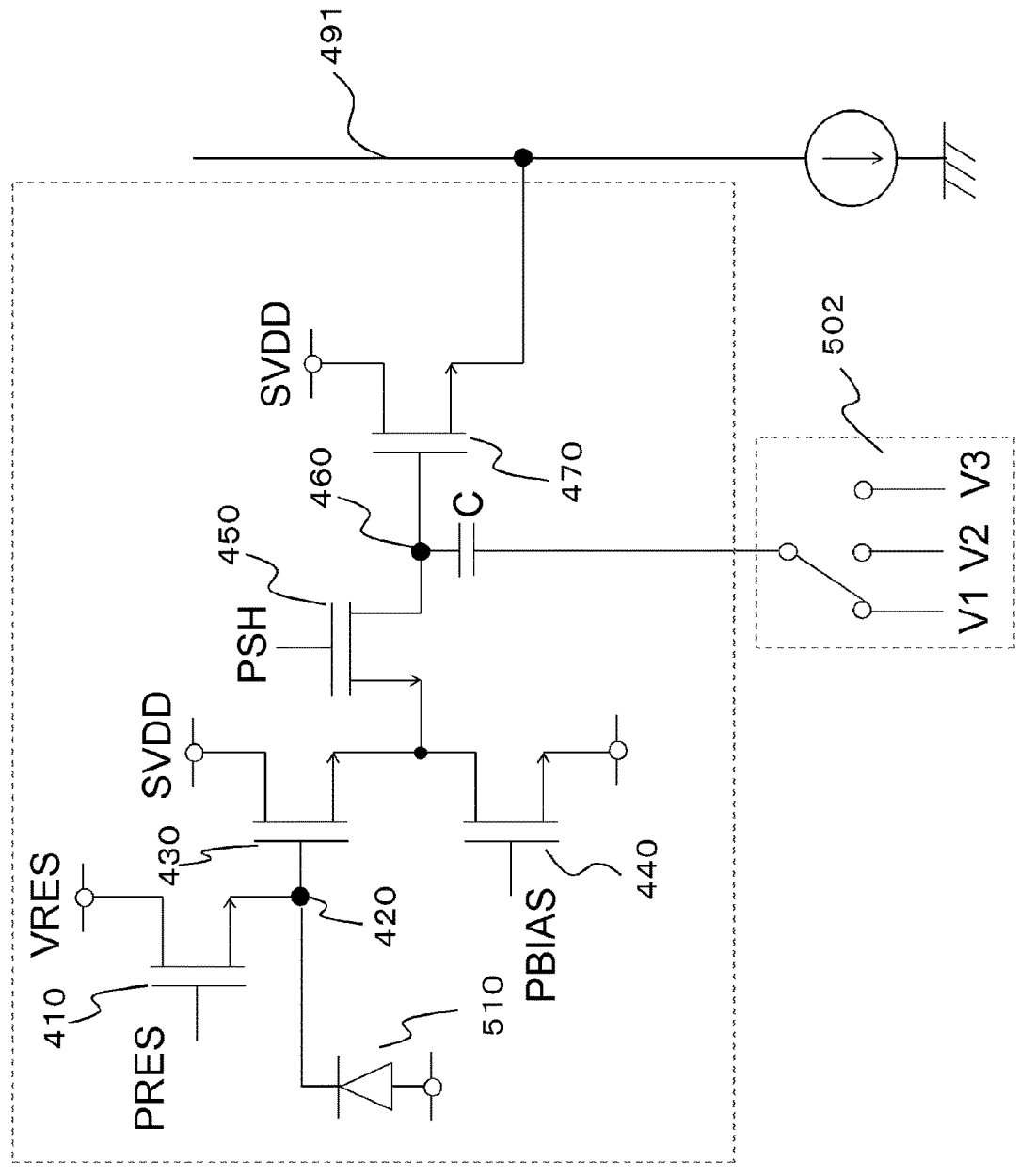
FIG. 8 is an example of an equivalent circuit diagram of a pixel circuit according to Embodiment 3.

FIG. 8 is an equivalent circuit diagram of a pixel circuit according to Embodiment 3. In Embodiment 3, three levels of voltage of the voltage switching circuit 503 can be selected, whereby both expanding the dynamic range (Embodiment 1) and decreasing a number of transistors (Embodiment 2) are implemented.

In Embodiment 3, there is no selection transistor 480, and the source of the second amplifier transistor is directly connected to the output line 492, just like Embodiment 2 (FIG. 6). Further in Embodiment 3, the voltage switching circuit 502 switches voltage V1, voltage V2 and voltage V3, and outputs the selected voltage (V1>V2>V3). Thereby in Embodiment 3, an operation integrating Embodiment 1 and Embodiment 2 is performed.

Figure 9:
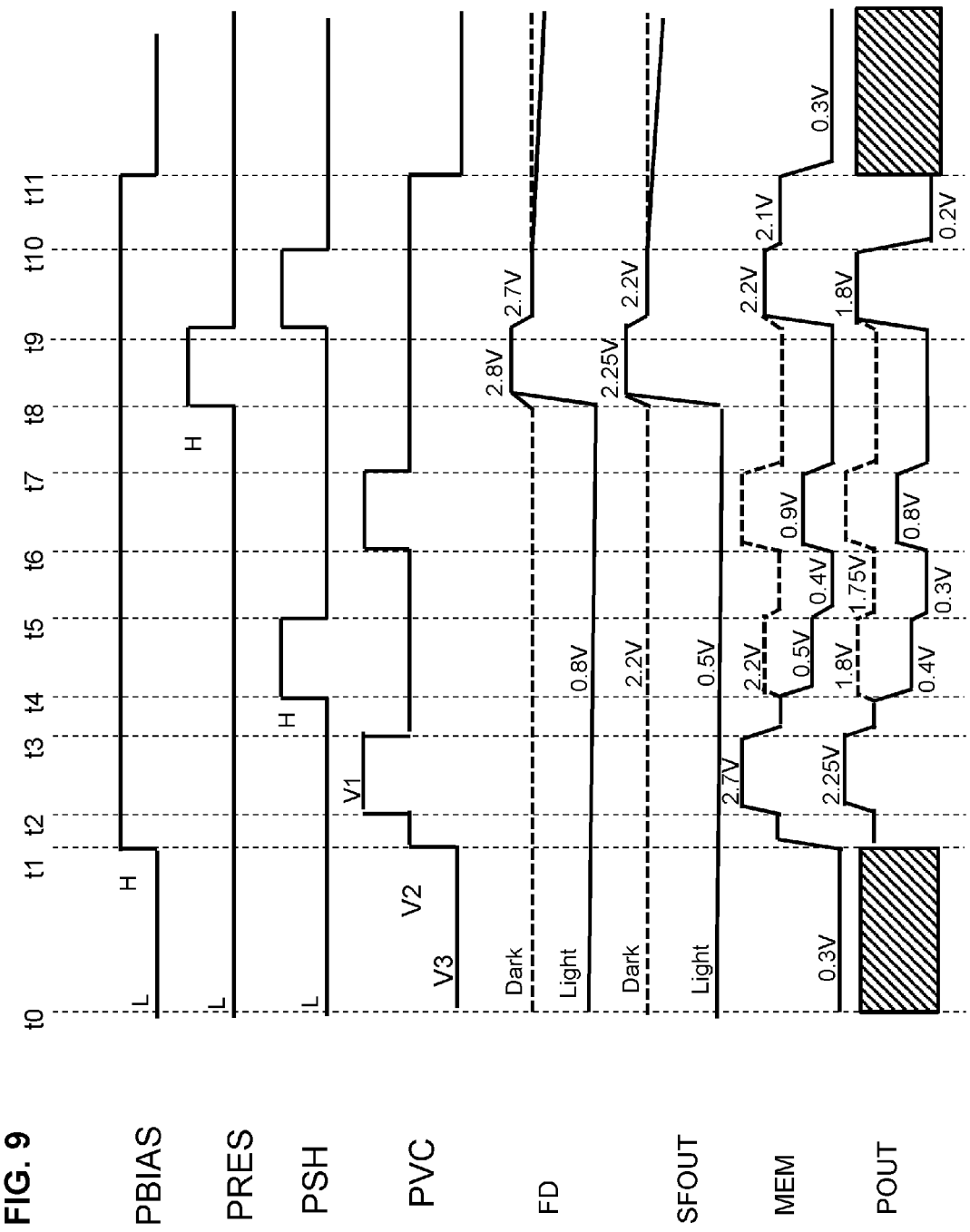
FIG. 9 is a diagram depicting driving of the pixel circuit according to Embodiment 3.

FIG. 9 is a diagram depicting driving of the pixel circuit in FIG. 8. The differences from Embodiment 2 will be mainly described herein below.

At time t2, PVC is changed from the potential V2 to the potential V1, whereby the potential of the second node MEM rises from 2.1 V to 2.7 V. The potential of the output line POUT rises to 2.25 V, and this potential is output. At this timing, the reading circuit 123 reads the potential (N signal) of the output line POUT.

At time t6, the potential of PVC is changed from the potential V2 to the potential V1 (V1>V2). Thereby if the light is not irradiated, the potential of the second node MEM rises to 2.7 V because of capacitor coupling, and 2.25 V is output to the output line POUT. In the case where the light is irradiated, the potential of the second node MEM rises to 0.9 V because of capacitor coupling, and 0.8 V is output to the output line POUT. At this timing, the reading circuit 123 reads the potential (S signal) of the output line POUT.

In the period between t0 and t11 and the period after t11, PVC is changed from the potential V2 to the potential V3, and the potential of the second node MEM drops from 2.1 V to 0.3 V. At this time, the second amplifier transistor 470 is in a non-driving state, and the pixel circuit is in an unselected state.

In this way, according to Embodiment 3, the terminal voltage of the capacitor C is switched from the voltage V2 to the voltage V1, and the signal voltage is shifted during the signal reading period, whereby the dynamic range can be expanded. Further, the driving state and the non-driving state of the second amplifier transistor 470 are switched, and the selected state and the unselected state of the pixel circuit are controlled by switching between voltage V2 and voltage V3, hence a number of transistors can be decreased.

In the pixel circuit of Embodiment 3, PMOS instead of NMOS may be used for each transistor, as described above. In the case of using PMOS, the H level and the L level of the driving pulse are reversed compared with the case of using NMOS, and the relationship of the voltage V1, the voltage V2 and the voltage V3 output from the voltage switching circuit 502 also become V1<V2<V3.

Embodiment 4

Figure 10:
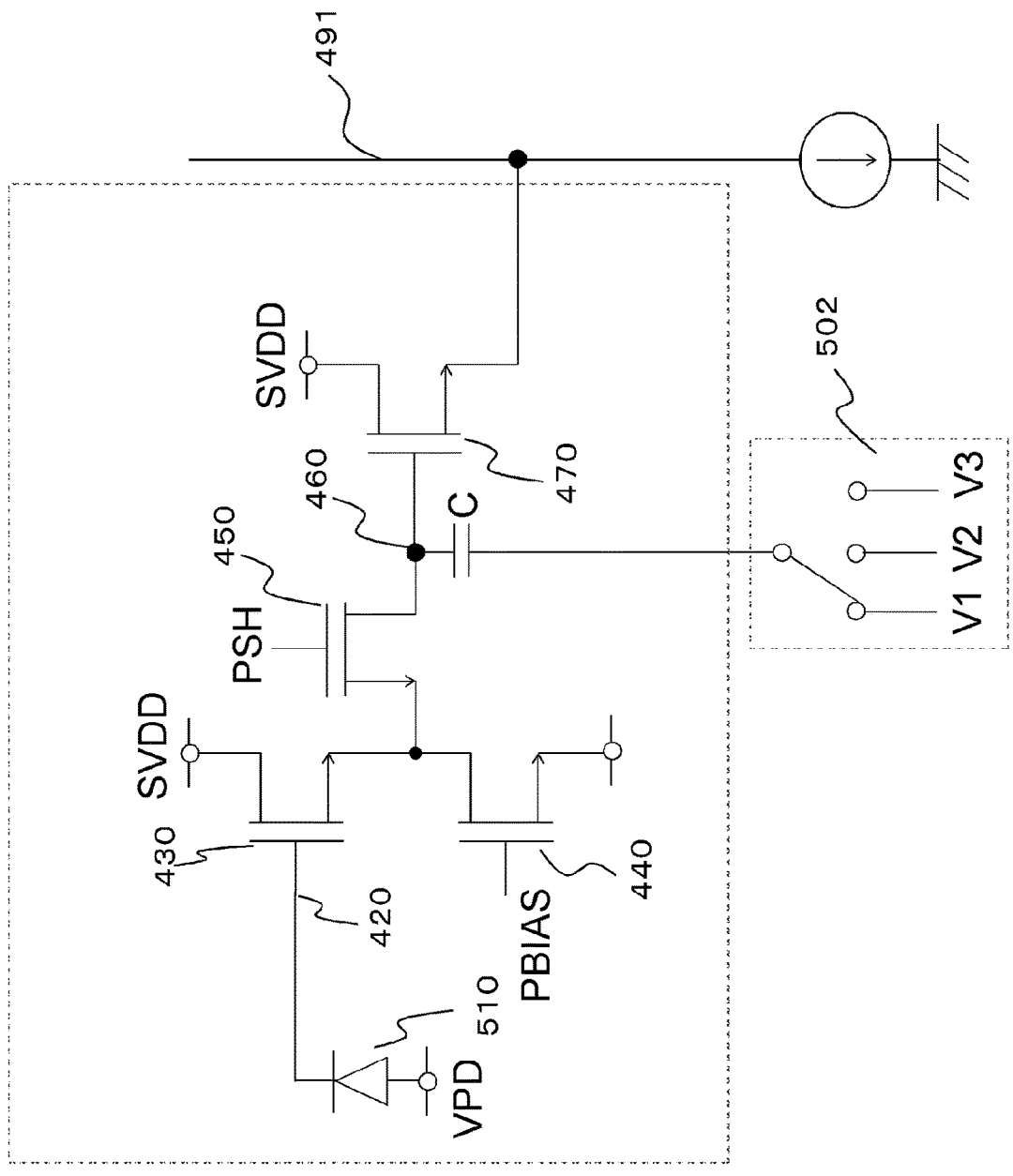
FIG. 10 is an example of an equivalent circuit diagram of a pixel circuit according to Embodiment 4.

FIG. 10 is an equivalent circuit diagram of a pixel circuit according to Embodiment 4. In Embodiment 3 (FIG. 8), the reset transistor 410 is not disposed. To perform the charging operation, voltage VPD is applied to the photoelectric conversion element 510 in a reverse bias state. To reset, on the other hand, the voltage VPD is switched to a forward bias state, whereby current is supplied from the photoelectric conversion element 510, and the first node FD 420 can be reset to a desired voltage.

Here a combination with Embodiment 3 was described, but Embodiment 4 may be implemented by combining with Embodiment 1 (FIG. 3) or Embodiment 2 (FIG. 6).

In this way, the method of implementing an expansion of the dynamic range and decrease in a number of transistors using the voltage switching circuit 502 can also be applied to a configuration in which the reset transistor 410 is not disposed.

Embodiment 5

Figure 11:
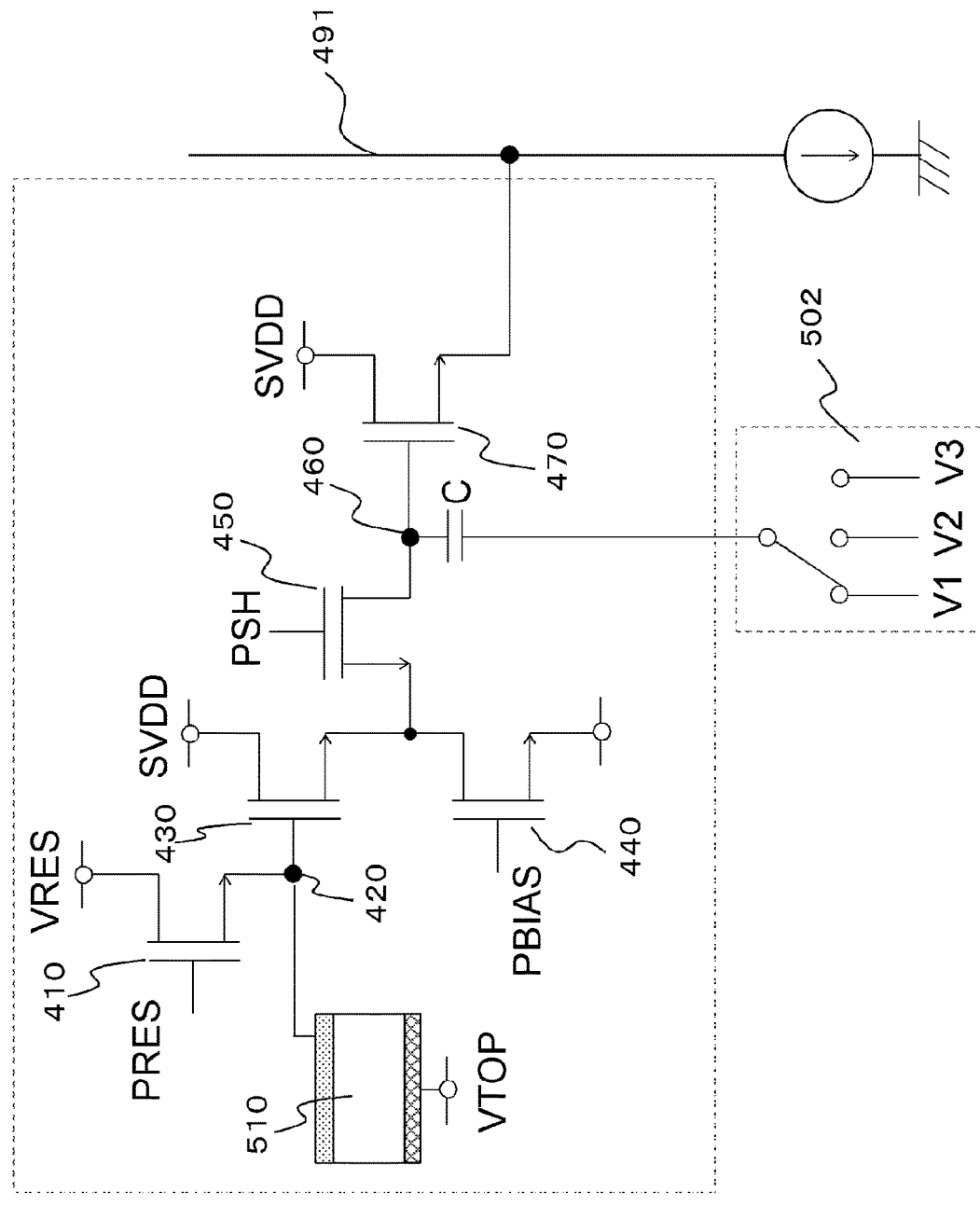
FIG. 11 is an example of an equivalent circuit diagram of a pixel circuit according to Embodiment 5.

FIG. 11 is an equivalent circuit diagram of a pixel circuit according to Embodiment 5. In Embodiment 5, a photoelectric conversion film is disposed as the photoelectric conversion unit 510 in the configuration of Embodiment 3 in FIG. 8. The photoelectric conversion film is layered onto the semiconductor substrate on which the pixel circuit is formed.

Figure 12B:
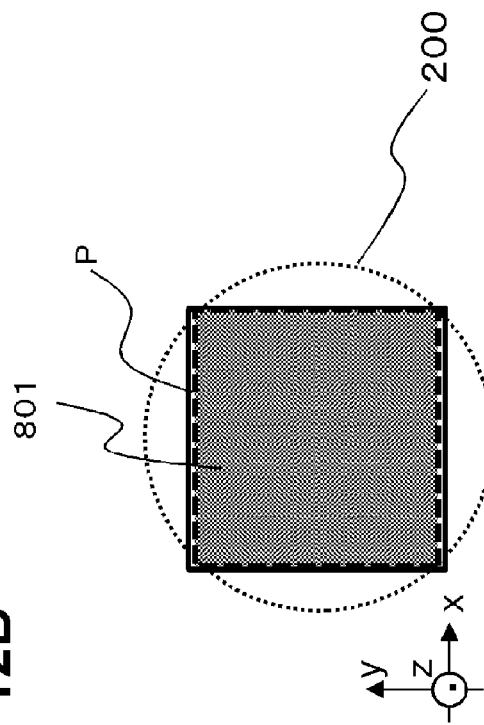
FIG. 12A and FIG. 12B are examples of a cross-sectional view and a plan view of a pixel according to Embodiment 5.
Figure 12A:
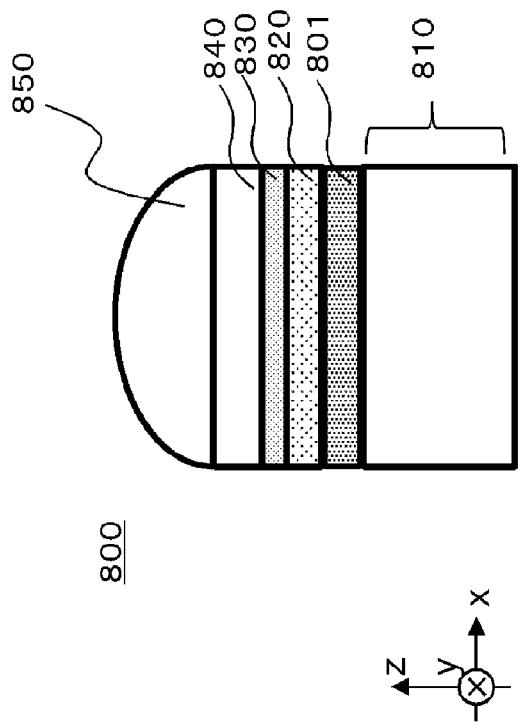

FIG. 12A is a cross-sectional view of a pixel 800 according to Embodiment 5, and FIG. 12B is a plan view of the pixel 800 at a certain height. In FIG. 12A, a member 810 schematically indicates a semiconductor substrate, a wiring layer, a reading circuit and the like. A pixel electrode 801 is disposed on the member 810.

A photoelectric conversion layer 820 and a counter electrode 830 (top electrode) are disposed on the pixel electrode 801. The photoelectric conversion layer 820 is disposed between the pixel electrode 801 and the counter electrode 830. A color filter 840 and a micro-lens 850 are disposed on the counter electrode 830.

The member 810 has a wiring layer which includes a plurality of insulating films and wires. The layer constituting the insulating film is made of silicon oxide, BPSG, PSG, PSG, silicon nitride or silicon carbide, for example. For the wires, such conductive materials as copper, aluminum, tungsten, tantalum, titanium and polysilicon are used.

The pixel electrode 801 is a thin film electrode, and is constituted of transparent or opaque conductive material, such as ITO and aluminum. The pixel electrode 801 is for separating and collecting charges generated in each region of the photoelectric conversion layer 820.

The photoelectric conversion layer 820 includes an organic compound which generates charges in accordance with the light quantity of incident light. A functional layer, to suppress the entry of charges from the electrode to the photoelectric conversion layer 820, such as a charge block layer, may be disposed between the photoelectric conversion layer 820 and the pixel electrode 801, or between the photoelectric conversion layer 820 and the counter electrode 830.

The counter electrode 830 is an electrode facing the pixel electrode 801, and is disposed so as to cover the photoelectric conversion layer 820. The counter electrode 830 is an electrode to apply voltage to the photoelectric conversion layer 820, and generate an electric field in the photoelectric conversion layer 820. The counter electrode 830 is disposed on the side that is closer to the light incidence surface rather than to the photoelectric conversion layer 820, hence the counter electrode 830 is constituted of such a conductive material as ITO, that is transparent with respect to the incident light.

The color filter 840 is a filter which transmits the light of R, G, B or C, M, Y. The color filter 840 may be a white filter or IR filter which transmits the light having an RGB or CMY wavelength. Particularly in the case of measuring distance, sensitivity can be improved by using a white filter for pixels to measure distance, since these pixels need not identify color. If a plurality of types of color filters 840 are used, and the step differences are generated among these color filters, a planarizing layer may be disposed on the color filters 840.

The micro-lens 850 is constituted of such material as resin. One pixel may be demarcated by a region in which one micro-lens is disposed, for example. FIG. 12B indicates an outer edge 200 of the micro-lens 850.

According to Embodiment 5, the light receiving area can be enlarged by disposing the photoelectric conversion film as the photoelectric conversion unit, therefore sensitivity can be improved. Further, a good incident angle characteristic can be implemented because no wires block the light between the color filter and the photoelectric conversion film.

Embodiment 6

Figure 13:
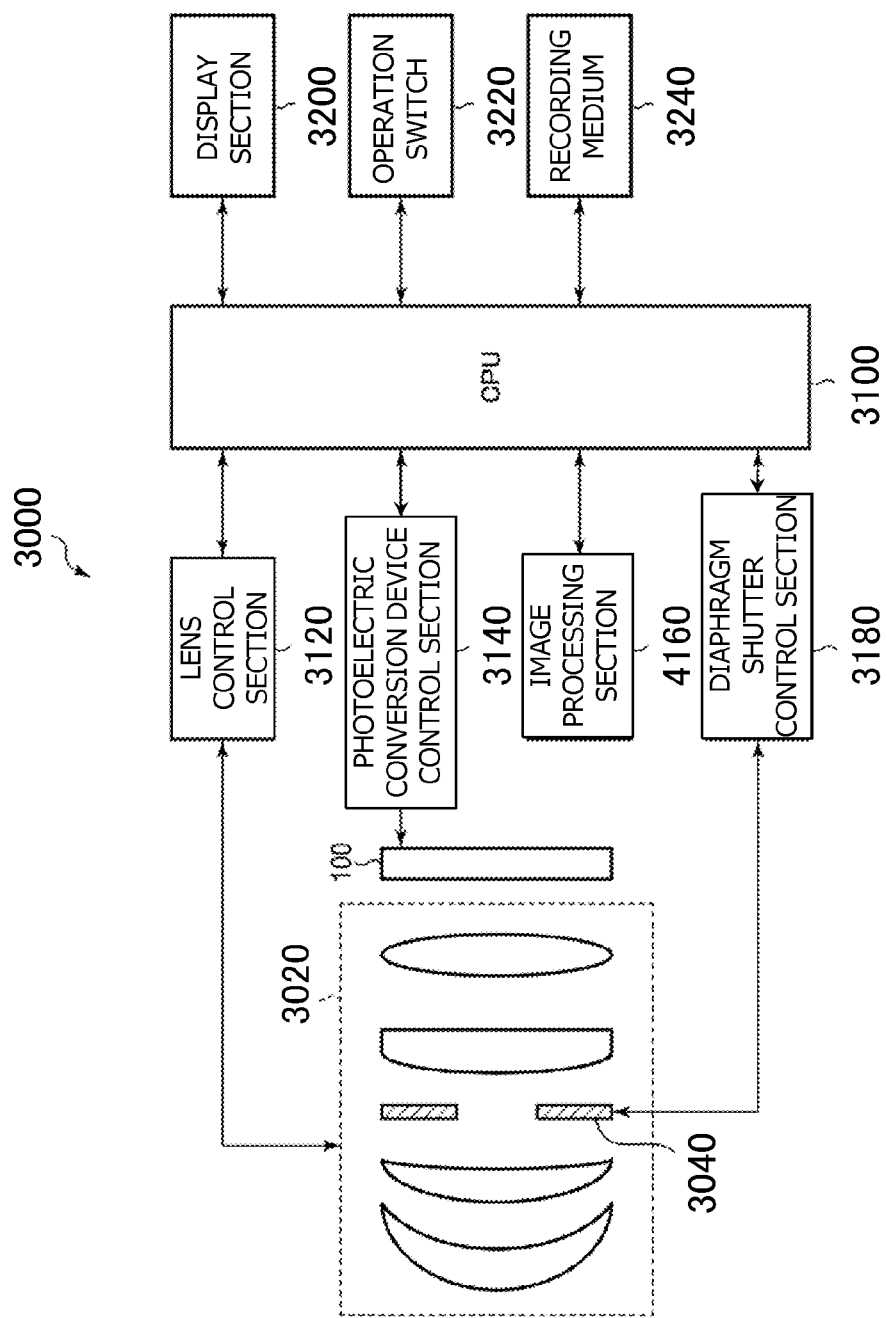
FIG. 13 is a diagram depicting a configuration example of an imaging system according to Embodiment 6.

An imaging system according to Embodiment 6 of the present invention will be described with reference to FIG. 13. FIG. 13 is a block diagram depicting a general configuration of the imaging system according to Embodiment 6.

The photoelectric conversion device described in Embodiments 1 to 5 can be applied to various imaging systems. The applicable image systems are not especially limited, and may be a digital still camera, a digital camcorder, a surveillance camera, a copier, a facsimile, a portable telephone, a dash cam, an observation satellite, a medical camera, and various other apparatuses. A camera module, which includes an optical system (e.g. lens) and a photoelectric conversion device (imaging device), is also included in the imaging system. FIG. 13 is a block diagram of a digital still camera, which is an example of these apparatuses.

As illustrated in FIG. 13, the imaging system 3000 includes a photoelectric conversion device 1000, an imaging optical system 3020, a CPU 3100, a lens control unit 3120, and a photoelectric conversion device control unit 3140. The imaging system 3000 also includes an image processing unit 3160, an aperture shutter control unit 3180, a display unit 3200, an operation switch 3220, and a recording medium 3240.

The imaging optical system 3020 is an optical system to form an optical image of an object, and includes a lens group, an aperture 3040 and the like. The aperture 3040 has a function to adjust the light quantity during photographing by adjusting the opening diameter thereof, and also has a function as a shutter to adjust the exposure time when a still image is photographed. The lens group and the aperture 3040 are mounted so as to be retractable in the optical axis direction, and the zoom function and focusing function are implemented by an interlocking operation of these components. The imaging optical system 3020 may be integrated with the imaging system, or may be an imaging lens which can be installed to the imaging system.

The photoelectric conversion device 1000 is disposed so that the imaging surface thereof is located in the image space of the imaging optical system 3020. The photoelectric conversion device 1000 is the photoelectric conversion device described in Embodiments 1 to 5, and is constituted by a CMOS sensor (pixel unit) and peripheral circuits thereof (peripheral circuit region). The photoelectric conversion device 1000 constitutes a two-dimensional single plate color sensor, where pixels having a plurality of photoelectric conversion units are two-dimensionally disposed, and color filters are disposed on these pixels. The photoelectric conversion device 1000 photo-electrically converts an object image formed by the imaging optical system 3020, and outputs the object image as image signals or as focus detection signals.

The lens control unit 3120 controls the extending/retracting driving of the lens group of the imaging optical system 3020 to perform zooming and focusing, and is constituted of circuits and processors to implement these functions. The aperture shutter control unit 3180 is for adjusting the imaging light quantity by changing the opening diameter of the aperture 3040 (changing the aperture stop), and is constituted of circuits and processors to implement these functions.

The CPU 3100 is a control device inside the camera to perform various controls of the camera main unit, and includes an operation unit, a ROM, a RAM, an A/D convertor, a D/A convertor, a communication interface circuit and the like. The CPU 3100 controls the operation of each component in the camera according to the computer program stored in ROM, for example, and executes a serious of photographing operations, such as AF, including detecting the focusing state (focus detection) of the imaging optical system 3020, imaging, image processing and recording. The CPU 3100 is also a signal processing unit.

The photoelectric conversion device control unit 3140 is for controlling the operations of the photoelectric conversion device 100, and for VD-converting the signals output from the photoelectric conversion device 1000 and transmitting the converted signals to the CPU 3100. The photoelectric conversion device control unit 3140 is constituted of circuits and controllers to implement these functions. The A/D conversion function may be included in the photoelectric conversion device 1000. The image processing unit 3160 is a processor to generate image signals by performing image processing, such as y conversion and color interpolation, on the A/D-converted signals, and is constituted of circuits and controllers to implement these functions. The display unit 3200 is a display device, such as a liquid crystal display (LCD), and displays: information on the photographing modes of the camera, a preview image before photographing, a confirmation image after photographing, and a focusing state during focus detection. The operation switch 3220 is constituted of a power switch, a release (photographing trigger) switch, a zoom operation switch, a photographing mode selection switch and the like. The recording medium 3240 is for recording photographed images, and may be included in the imaging system, or may be removable, such as a memory card.

Constructing the imaging system 3000 by applying the photoelectric conversion device 1000 according to Embodiments 1 to 5 like this, a high performance imaging system can be implemented.

Embodiment 7

Figure 14A:
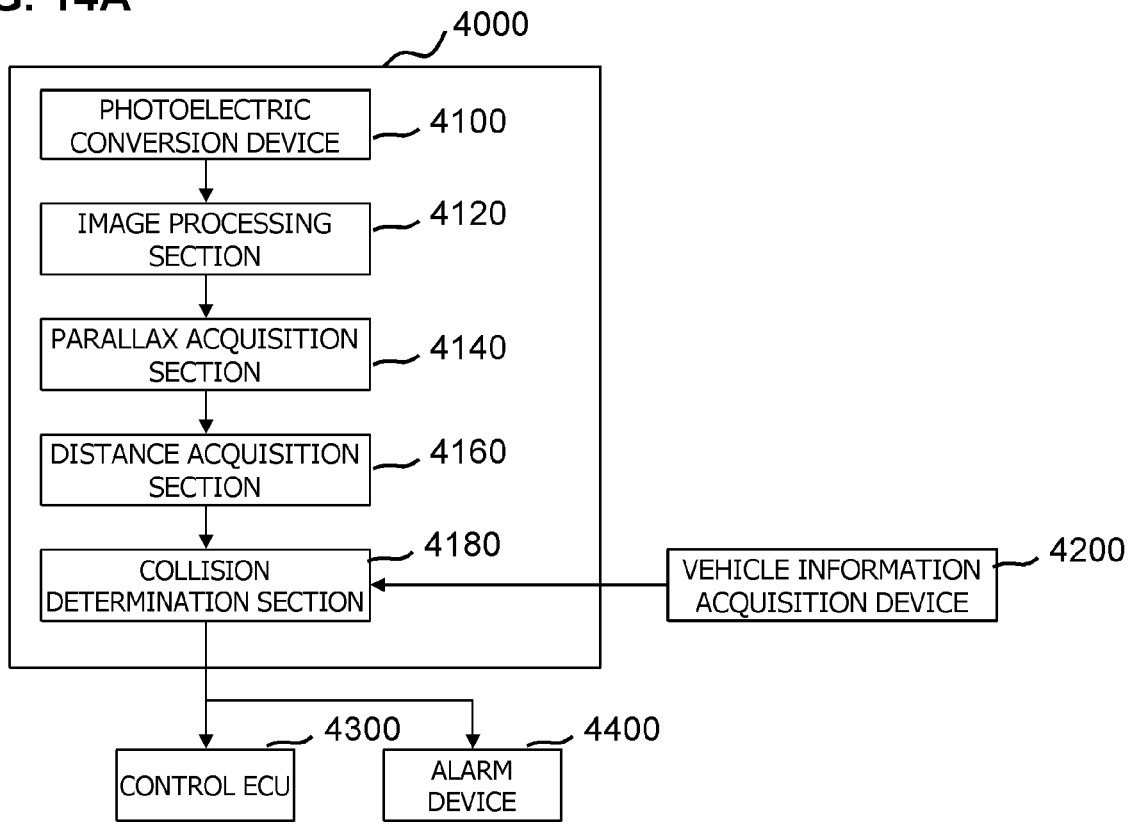
FIG. 14A and FIG. 14B are diagrams depicting configuration examples of an imaging system and a mobile body according to Embodiment 7.
Figure 14B:
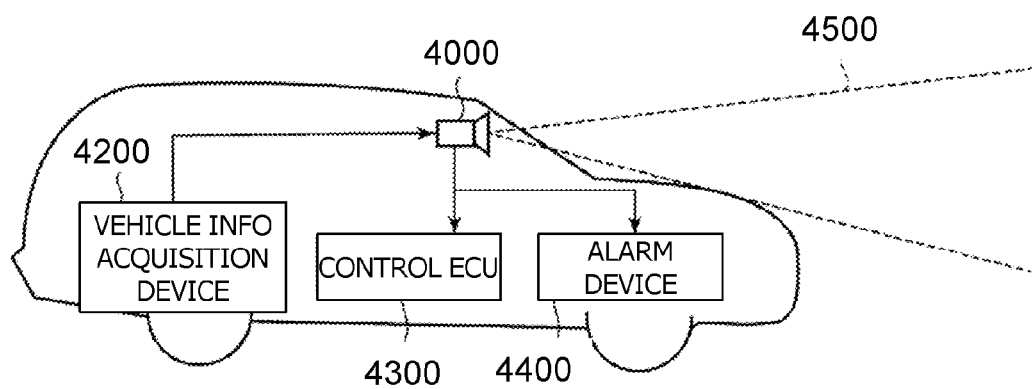

A photoelectric conversion system and a moving body according to the Seventh Embodiment of the present invention will be described by reference to FIGS. 14A and 14B. FIGS. 14A and 14B are each a view showing the configuration of the photoelectric conversion system and the moving body according to the present embodiment.

FIG. 14A shows one example of a photoelectric conversion system 4000 regarding a vehicle-mounted camera. The photoelectric conversion system 4000 has a photoelectric conversion device 4100. The photoelectric conversion device 4100 is any of the photoelectric conversion devices described in the First to Fifth Embodiments. The photoelectric conversion system 4000 has an image processing part 4120 of a processing device for performing image processing on a plurality of image data acquired by the photoelectric conversion device 4100, and a parallax acquisition part 4140 of a processing device for performing calculation of parallax (phase difference between parallax images) from a plurality of image data acquired from the photoelectric conversion device 4100. Further, the photoelectric conversion system 4000 has a distance acquisition part 4160 of a processing device for calculating the distance to the object based on the calculated parallax, and an impact determination part 4180 of a processing device for determining whether there is an impact possibility or not based on the calculated distance. Herein, the parallax acquisition part 4140 or the distance acquisition part 4160 is one example of information acquisition means for acquiring information such as the distance to the object. Namely, the distance information is information regarding the parallax, the defocus amount, the distance to the object, and the like. The impact determination part 4180 may determine the impact possibility using any of the distance information. The processing device may be implemented by hardware designed for exclusive use, or may be implemented by general-purpose hardware for performing operations based on a software module. Further, the processing device may be implemented by a field programmable gate array (FPGA), an application specific integrated circuit (ASIC), or the like, or may be implemented by a combination thereof.

The photoelectric conversion system 4000 is connected with a vehicle information acquisition device 4200, and can acquire vehicle information such as the vehicle speed, the yaw rate, and the steering angle. Further, the photoelectric conversion system 4000 is connected with a control ECU 4300 of a control device for outputting a control signal for generating a damping force to a vehicle based on the determination result at the impact determination part 4180. Namely, the control ECU 4300 is one example of moving body control means for controlling the moving body based on the distance information. Further, the photoelectric conversion system 4000 is also connected with an alarm device 4400 for issuing an alarm to a driver based on the determination result at the impact determination part 4180. For example, when the impact possibility is high as the determination result of the impact determination part 4180, the control ECU 4300 brakes, returns the accelerator, suppresses the engine output, or performs other operations, and thereby performs vehicle control of avoiding an impact, and reducing the damage. The alarm device 4400 sounds an alarm such as a sound, displays alarm information on a screen of a car navigation system, or the like, applies a vibration to a sheet belt or a steering, or performs other operations, and thereby warns a user.

In the present embodiment, the periphery such as the front or the back of a vehicle is imaged by the photoelectric conversion system 4000. FIG. 14B shows the photoelectric conversion system 400 when the vehicle front (imaging region 4500) is imaged. The vehicle information acquisition device 4200 sends an instruction for the photoelectric conversion system 4000 to operate, and to execute imaging. By using each photoelectric conversion device of the First to Fifth Embodiments as the photoelectric conversion device 4100, the photoelectric conversion system 4000 of the present embodiment can be more improved in distance measurement precision.

In the description up to this point, a description has been given to the example in which control is performed so as to prevent the impact with another vehicle. However, the present invention is also applicable to control of following another vehicle for automatic driving, control of automatically driving so as not to deviate from the lane, and the like. Further, the photoelectric conversion system is applicable to moving bodies (transport devices) such as ships, aircrafts, or industrial robots, not limited to vehicles such as cars. The moving bodies (transport devices) are various driving sources such as an engine, a motor, a wheel, and a propeller. In addition, the present invention is applicable to devices widely using object recognition such as Intelligent transport system (ITS), not limited to the moving bodies.

Other Embodiments

The photoelectric conversion device may have a structure (chip lamination structure) of lamination of a first semiconductor chip including pixels provided therein, and a second semiconductor chip including a read circuit (amplifier) provided therein. The read circuits (amplifiers) in the second semiconductor chip can be each a row circuit corresponding to the pixel row of the first semiconductor chip. Further, the read circuits (amplifiers) in the second semiconductor chip can each be a matrix circuit corresponding to the pixel or the pixel block of the first semiconductor chip. For the connection between the first semiconductor chip and the second semiconductor chip, there can be adopted connection by through electrode (TSV), interchip wiring by direct junction of a metal such as copper (Cu), interchip microbumping, or the like.

The above embodiments and arrangement examples are only those showing examples of embodiment in practicing the present invention, and shall not be those by which the technical scope of the present invention is construed as being restrictive. That is, the present invention may be practiced in various forms without deviation from its technical idea or its main features. In addition, the individual embodiments and the individual arrangement examples described above may be combined or modified whenever possible within the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-64782, filed on Mar. 29, 2018, which is hereby incorporated by reference herein in its entirety.

What is claimed is:
1. A photoelectric conversion device comprising:
a photoelectric conversion unit;
a storing unit configured to store a photoelectric conversion signal from the photoelectric conversion unit;
a first amplifier transistor configured to output a photoelectric conversion signal from the storing unit;
a transistor configured to write an output signal of the first amplifier transistor to a first terminal of a holding capacitor;
a second amplifier transistor, a gate of which is connected to the first terminal, and which is configured to output a voltage in accordance with a voltage of the first terminal; and
a control unit configured to switch a voltage of a second terminal of the holding capacitor,
wherein the control unit (1) sets the voltage of the second terminal to a first voltage in a period of reading a signal corresponding to a reset potential of the storing unit and a period of reading the photoelectric conversion signal, (2) and sets the voltage of the second terminal to a second voltage in the other periods.

2. The photoelectric conversion device according to claim 1, further comprising a plurality of pixels arranged two-dimensionally, wherein each of the pixels includes the photoelectric conversion unit, the storing unit, the first amplifier transistor, the transistor, and the second amplifier transistor.

3. A photoelectric conversion device comprising:
a photoelectric conversion unit;
a storing unit configured to store a photoelectric conversion signal from the photoelectric conversion unit;
a first amplifier transistor configured to output a photoelectric conversion signal from the storing unit;
a transistor configured to write an output signal of the first amplifier transistor to a first terminal of a holding capacitor;
a second amplifier transistor, a gate of which is connected to the first terminal, and which is configured to output a voltage in accordance with a voltage of the first terminal; and
a control unit configured to switch a voltage of a second terminal of the holding capacitor,
wherein for a selected pixel, the control unit sets the second amplifier transistor to a driving state by setting the voltage of the second terminal to a second voltage, and
wherein for an unselected pixel, the control unit sets the second amplifier transistor to a non-driving state by setting the voltage of the second terminal to a third voltage.

4. The photoelectric conversion device according to claim 1,
wherein the first amplifier transistor and the second amplifier transistor are NMOS source-follower circuits, and
wherein the first voltage is higher than the second voltage.

5. The photoelectric conversion device according to claim 3,
wherein the first amplifier transistor and the second amplifier transistor are NMOS source-follower circuits, and
wherein the third voltage is lower than the second voltage.

6. The photoelectric conversion device according to claim 1,
wherein the first amplifier transistor and the second amplifier transistor are PMOS source-follower circuits, and
wherein the first voltage is lower than the second voltage.

7. The photoelectric conversion device according to claim 3,
wherein the first amplifier transistor and the second amplifier transistor are PMOS source-follower circuits, and
wherein the third voltage is higher than the second voltage.

8. The photoelectric conversion device according to claim 1,
wherein the second terminal of the holding capacitor is commonly connected for each row, and
wherein the control unit switches the voltage of the second terminal of the holding capacitor for each row.

9. The photoelectric conversion device according to claim 1, wherein the photoelectric conversion unit includes a pixel electrode, a photoelectric conversion film and an upper electrode.

10. An imaging system comprising:
the photoelectric conversion device according to claim 1; and
a signal processing unit configured to process a signal output from the photoelectric conversion device.

11. A mobile body comprising:
the photoelectric conversion device according to claim 1;
a mobile device;
a processing device configured to acquire information from a signal output from the photoelectric conversion device; and
a control device configured to control the mobile device based on the information.

12. The photoelectric conversion device according to claim 3, further comprising a plurality of pixels arranged two-dimensionally, wherein each of the pixels includes the photoelectric conversion unit, the storing unit, the first amplifier transistor, the transistor, and the second amplifier transistor.

13. The photoelectric conversion device according to claim 3,
wherein the second terminal of the holding capacitor is commonly connected for each row, and
wherein the control unit switches the voltage of the second terminal of the holding capacitor for each row.

14. The photoelectric conversion device according to claim 3, wherein the photoelectric conversion unit includes a pixel electrode, a photoelectric conversion film and an upper electrode.

15. An imaging system comprising:
the photoelectric conversion device according to claim 3; and
a signal processing unit configured to process a signal output from the photoelectric conversion device.

16. A mobile body comprising:
the photoelectric conversion device according to claim 3;
a mobile device;
a processing device configured to acquire information from a signal output from the photoelectric conversion device; and
a control device configured to control the mobile device based on the information.

* * * * *